United States Patent
Lou

(10) Patent No.: US 6,319,770 B1
(45) Date of Patent: Nov. 20, 2001

(54) METHOD FOR FABRICATING A BOTTOM ELECTRODE OF A DYNAMIC RANDOM ACCESS MEMORY CAPACITOR

(75) Inventor: Chine-Gie Lou, Hsinchu Hsien (TW)

(73) Assignee: Taiwan Semiconductor Manufactruing Co., LTD, Hsin-Chu (TW)

( * ) Notice: Subject to any disclaimer, the term of this patent is extended or adjusted under 35 U.S.C. 154(b) by 0 days.

(21) Appl. No.: 09/609,265

(22) Filed: Jun. 30, 2000

(30) Foreign Application Priority Data

Nov. 18, 1999 (TW) ................................................. 88120128

(51) Int. Cl.$^7$ ............................................... H01L 21/8242
(52) U.S. Cl. ........................................... 438/255; 438/398
(58) Field of Search ................................... 438/253, 254, 438/255, 396, 397, 398, 3, 240

(56) References Cited

U.S. PATENT DOCUMENTS

| | | | |
|---|---|---|---|
| 5,879,987 | * 3/1999 | Wang | 438/253 |
| 6,063,660 | * 5/2000 | Tseng et al. | 438/253 |
| 6,100,129 | * 8/2000 | Tu et al. | 438/238 |
| 6,114,201 | * 9/2000 | Wu | 438/254 |
| 6,162,680 | * 12/2000 | Lou | 438/254 |
| 6,218,230 | * 4/2001 | Fujiwara et al. | 438/238 |

* cited by examiner

Primary Examiner—Tuan H. Nguyen
(74) Attorney, Agent, or Firm—Darby & Darby

(57) ABSTRACT

The present invention provides a method for fabricating a bottom electrode of a dynamic random access memory (DRAM) capacitor. First, a first sacrificial layer, an intermediate layer and a second sacrificial layer are sequentially formed on a substrate. Then, an aperture is formed on the first sacrificial layer, the intermediate layer and the second sacrificial layer. An annular groove is then formed in the inner circumferential surface of the aperture by removing a fixed depth of the intermediate layer. After that, the aperture and the annular groove are filled with a first amorphous silicon layer, a second amorphous silicon layer and a third amorphous silicon layer. The second amorphous silicon layer has a lower impurity concentration than those of the first amorphous silicon layer and the third amorphous silicon layer. The first amorphous silicon layer and the second amorphous silicon layer both fill into the annular groove and form an annular ring. Next, the first sacrificial layer and the second sacrificial layer are removed to reveal the first amorphous silicon layer. Next, a predetermined depth of the first amorphous silicon layer is removed to reveal the second amorphous silicon layer. Then, the intermediate layer is removed to reveal the first amorphous silicon layer at the annular ring. Finally, a plurality of hemispherical grains are formed on the first amorphous silicon layer and the second amorphous silicon layer.

18 Claims, 7 Drawing Sheets

METHOD FOR FABRICATING A BOTTOM ELECTRODE OF A DYNAMIC RANDOM ACCESS MEMORY CAPACITOR

BACKGROUND OF THE INVENTION

1. Field of the Invention

The present invention generally relates to a method for fabricating a bottom electrode of a dynamic random access memory (DRAM) capacitor. More specifically, the present invention relates to a method that can enlarge the surface area of the bottom electrode of a DRAM capacitor.

2. Description of the Related Art

A DRAM cell is constructed of a MOS transistor and a capacitor, wherein the charge storage ability of the capacitor is utilized to store information. Because of charge leakage paths, such as the inverse bias leakage path of a PN junction, it is necessary to recharge or discharge the capacitor of a cell at regular intervals to keep the stored information correct. This is called refreshing. The longer the refresh interval, the more stable the stored information. Furthermore, the power consumption of the DRAM cell is less.

One way to prolong the refresh interval is to increase the capacitance of the capacitor. This can be accomplished by enlarging the surface area of the bottom electrode of the capacitor. FIG. 1 is a cross-sectional view of a capacitor using a fin structure to increase the surface area of the bottom electrode. The fin structure has an inter-poly dielectric layer 12 and a poly plug 14 formed therein to act as a node contact. A bottom electrode superposing on the poly plug 14 has a main stem 16 and an annular ring 18. The main stem 16 and the annular ring 18 are usually made of amorphous silicon doped with phosphorous. An inter-plate dielectric layer 22 electrically separates the top electrode 20 and the bottom electrode. As shown in FIG. 1, the annular ring 18 enlarges the surface area of the bottom electrode.

As illustrated in FIG. 2, hemispherical grains can be applied to the fin structure of the bottom electrode in FIG. 1 to further enlarge the surface area. The distended surfaces of the hemispherical grains increase the surface area of the bottom electrode. The larger the diameters of the hemispherical grains, the larger the capacitance.

The diameter of a hemispherical grain has strong correlation with the impurity concentration of the amorphous silicon at the location where the hemisphere grain grows. The lower the impurity concentration, the larger the diameter of the hemispherical grain and the larger the capacitance of the capacitor. However, a bottom electrode with hemispherical grains having large diameters has an increased probability of contacting and shorting with an adjacent bottom electrode. Further, if the impurity concentration of the amorphous silicon is lessened to grow large hemispherical grains, the depletion region of the surface of the hemispherical grains will be enlarged. This result decreases the capacitance.

SUMMARY OF THE INVENTION

Therefore, a major object of the present invention is to provide a method for fabricating a bottom electrode having a fin structure with hemispherical grains without the aforementioned disadvantages.

The present invention achieves the above-indicated object by providing a method for fabricating a bottom electrode of a dynamic random access memory (DRAM) capacitor. First, a first sacrificial layer, an intermediate layer and a second sacrificial layer are sequentially formed on a substrate. Then, an aperture is formed on the first sacrificial layer, the intermediate layer and the second sacrificial layer. After that, an annular groove is formed in the inner circumferential surface of the aperture by removing a fixed depth of the intermediate layer. Then, the aperture and the annular groove are filled with a first amorphous silicon layer, a second amorphous silicon layer and a third amorphous silicon layer. The second amorphous silicon layer has a lower impurity concentration than those of the first amorphous silicon layer and the third amorphous silicon layer do. The first amorphous silicon layer and the second amorphous silicon layer both fill into the annular groove and form an annular ring. Next, the first sacrificial layer and the second sacrificial layer are removed to reveal the first amorphous silicon layer. Next, a predetermined depth of the first amorphous silicon layer is removed to reveal the second amorphous silicon layer. Then, the intermediate layer is removed to reveal the first amorphous silicon layer at the annular ring. Finally, a plurality of hemispherical grains are formed on the first amorphous silicon layer and the second amorphous silicon layer.

The advantage of the present invention is to dramatically increase the capacitance of the capacitor. When the hemispherical grains are being formed, the sidewall of the annular ring is the closest portion of the bottom electrode to the adjacent bottom electrode Because the sidewall of the annular ring is covered with the first amorphous silicon layer having a higher impurity concentration covering, the grain size of hemispherical grains at the sidewall of the annular ring will be smaller, thereby preventing the occurrence of electrical shorting. Furthermore, since most surface of the bottom electrode is made of the second amorphous silicon layer having a lower impurity concentration, the grain size formed thereon will be larger, thereby increasing the surface area of the bottom electrode. By this means, the capacitance is increased. In addition, the impurity in the third amorphous silicon layer is diffused into the hemispherical grains by means a subsequent thermal treatment process, thereby decreasing the depletion region at the surfaces of the hemispherical grains.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

Figure 1:
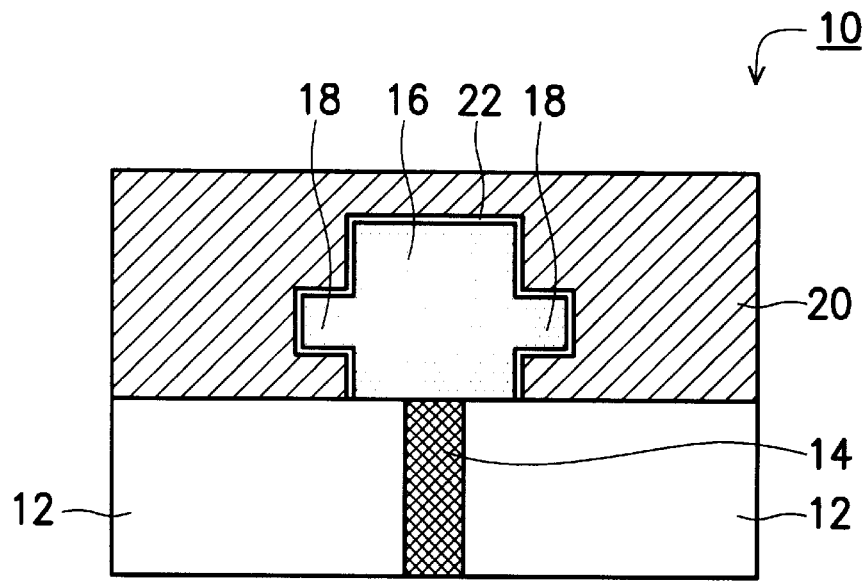
FIG. 1 is a cross-sectional view of a fin structure.
Figure 2:
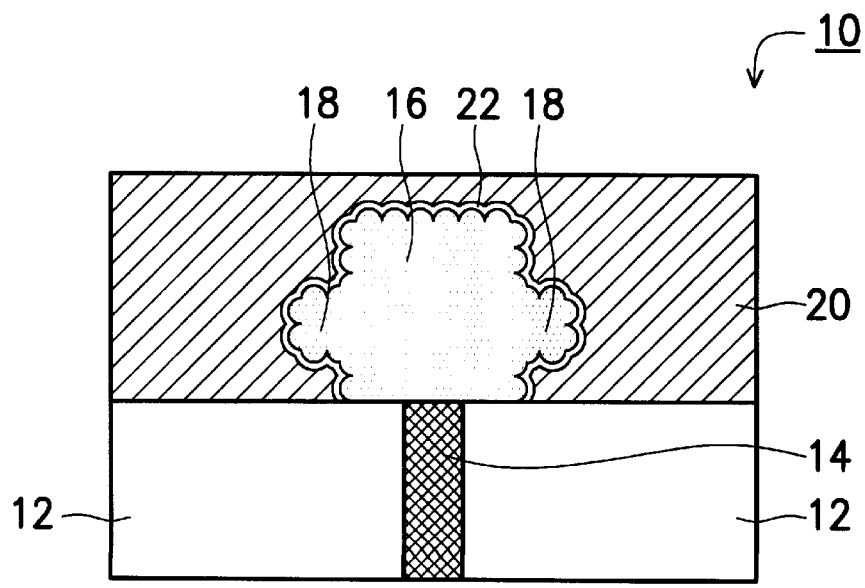
FIG. 2 illustrates a modification of the fin structure in FIG. 1.

The present invention provides a method for fabricating a bottom electrode of a dynamic random access memory (DRAM) capacitor with a huge surface area. In the drawings, like reference numbers indicate identical or functionally similar elements.

Figure 3:
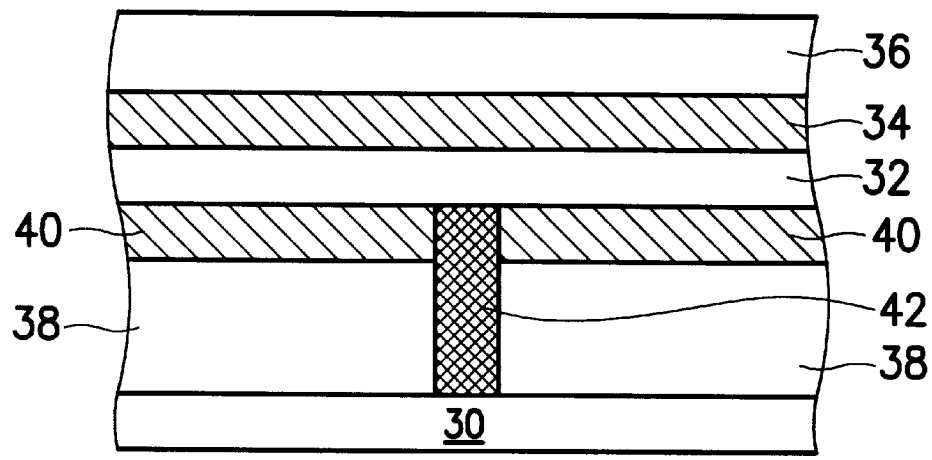
FIG. 3 to FIG. 13 are cross-sectional diagrams illustrating the method of fabricating the bottom electrode according to the present invention.

Refer to FIG. 3. First, a first sacrificial layer 32, an intermediate layer 34 and a second sacrificial layer 36 are formed on a substrate 30. The substrate 30 comprises an inter-poly dielectric layer 38 made of silicon oxide, and a cap nitride layer 40 on the inter-poly dielectric layer 38. The substrate 30 further has a poly-plug 42 formed in the cap nitride layer 40 and the inter-poly dielectric layer 38. The first sacrificial layer 32, the intermediate layer 34 and the second sacrificial layer 36 can be formed by such as chemical vapor deposition processes. Preferably, the first sacrificial layer 32 and the second sacrificial layer 36 are made of silicon oxide, and the intermediate layer 34 is made of silicon nitride.

Figure 4:
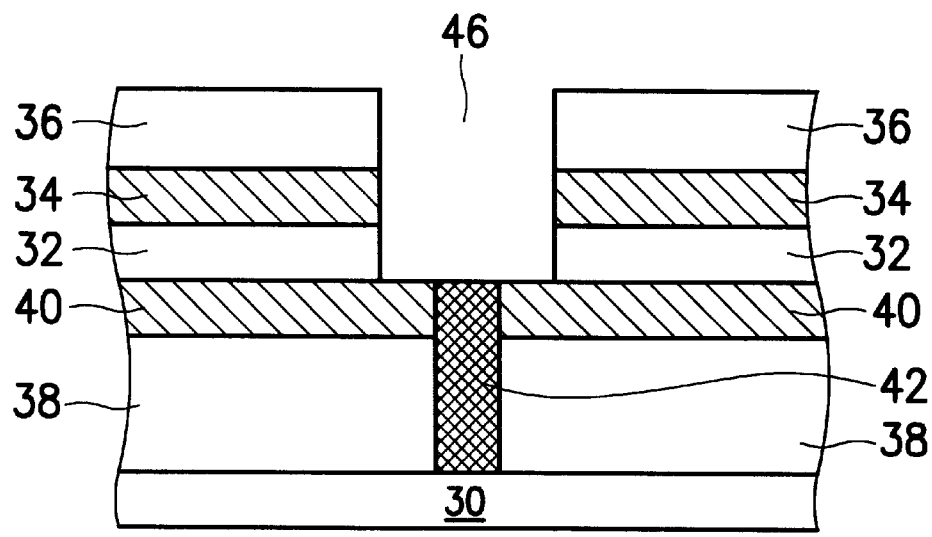

Then, an aperture 46 is formed on the first sacrificial layer 32, the intermediate layer 34 and the second sacrificial layer 36, as shown in FIG. 4. For example, a lithography process can be used to form a photoresist layer with an opening at the predetermined region of the aperture 46. A subsequent plasma etch process can downwardly remove the second sacrificial 36, the intermediate layer 34 and the first sacrificial layer 32 under the opening until reaching the surface of the cap nitride layer 40. Therefore, the aperture 46 is formed as shown in FIG. 4.

Figure 5:
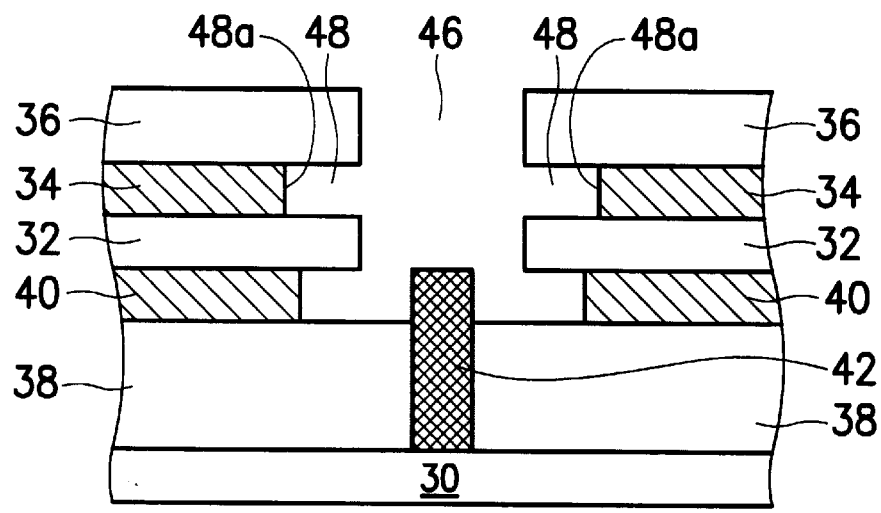

An annular groove 48 is formed in the inner circumferential surface of the aperture 46 by removing a fixed depth of the uncovered intermediate layer 34, as shown in FIG. 5. For example, a wet etching process with an etching solution of hot phosphoric acid is used to remove a predetermined thickness of the intermediate layer 34 in the inner circumferential surface of the aperture 46. Since the material of the cap nitride layer 40 is the same as that of the intermediate layer 34, a portion of the uncovered cap nitride layer 40 will also be removed during this wet etching process, as shown in FIG. 5.

Figure 6:
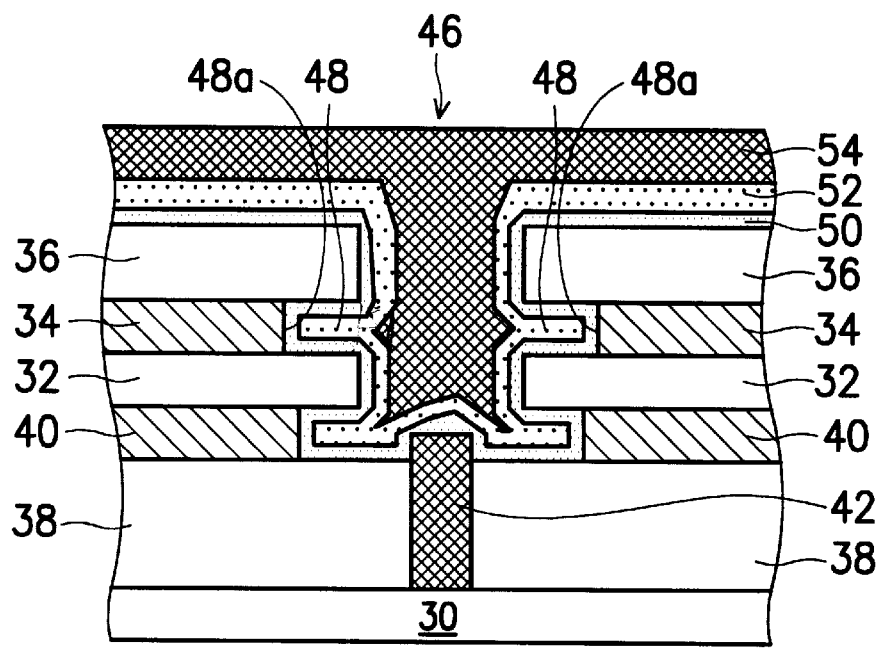

After that, the aperture 46 and the annular groove 48 are filled with a first amorphous silicon layer 50, a second amorphous silicon layer 52 and a third amorphous silicon layer 54. The second amorphous silicon layer 52 has a lower impurity concentration than those of the first amorphous silicon layer 50 and the third amorphous silicon layer 54. The first amorphous silicon layer 50 and the second amorphous silicon layer 52 both fill into the annular groove 48 and form an annular ring, as shown in FIG. 6. For example, the first amorphous silicon layer 50, the second amorphous silicon layer 52 and the third amorphous silicon layer 54 can be formed on the surface of the substrate 30 by a low pressure chemical vapor deposition (LPCVD) process at a temperature of 500° C. to 520° C. The impurity can be in situ doped into the first amorphous silicon layer 50, the second amorphous silicon layer 52 and the third amorphous silicon layer 54. For example, in the preferred embodiment of the invention, the impurity concentration of the second amorphous silicon layer 52 is almost zero, the impurity concentration of the first amorphous silicon layer 50 is between $2*10^{20}$ and $4*10^{20}$ atoms/cm$^3$, and the impurity concentration of the third amorphous silicon layer 54 is higher than $4*10^{20}$ atoms/cm$^3$.

Figure 7:
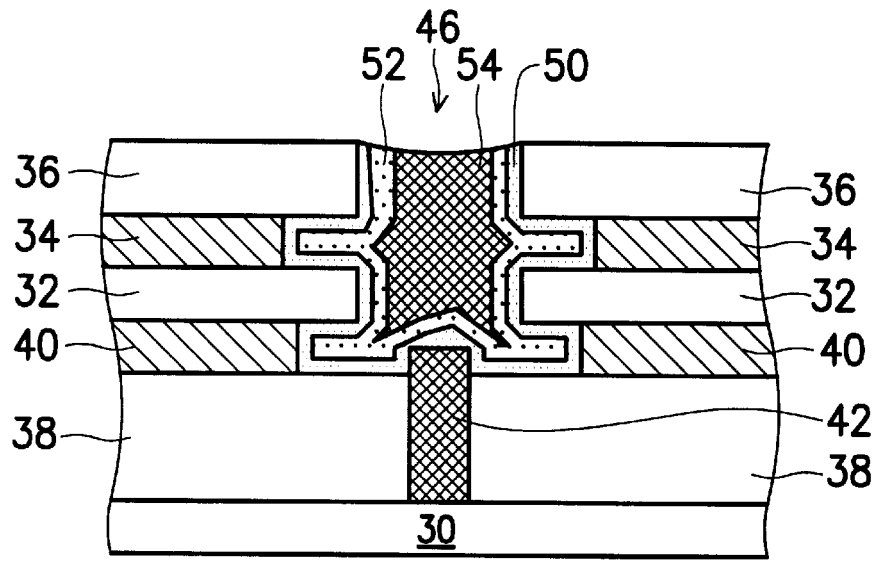

Next, a removing step is executed to make the top surfaces of the first amorphous silicon layer 50, the second amorphous silicon layer 52 and the third amorphous silicon layer 54 even with the surface of the second sacrificial layer 36, as shown in FIG. 7. For example, an anisotropic etch back process or a chemical mechanical polish (CMP) process can remove the portions of the first amorphous silicon layer 50, the second amorphous silicon layer 52 and the third amorphous silicon layer 54 which is higher than the surface of the second sacrificial layer 36.

Figure 8:
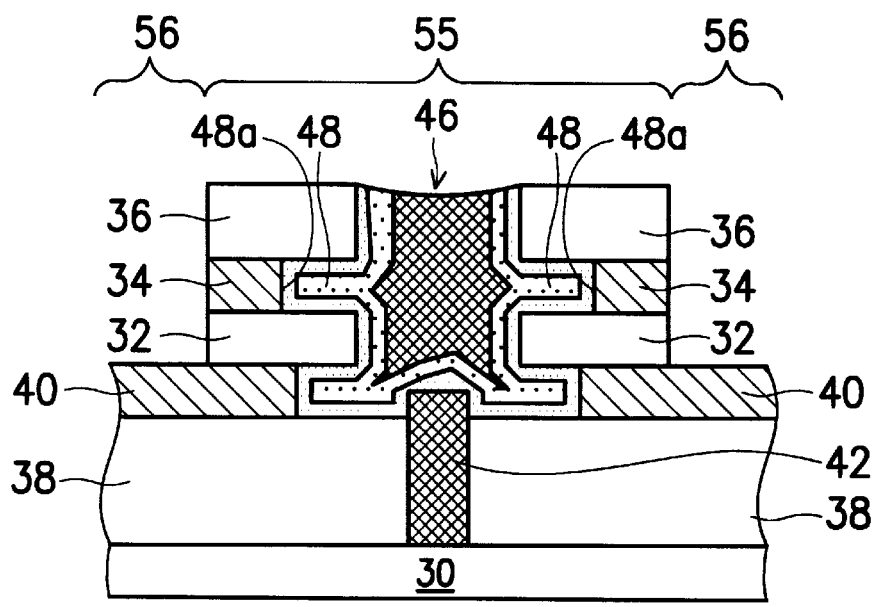

Then, the first sacrificial layer 32, the intermediate layer 34 and the second sacrificial layer 36 inside a predetermined region 56 that is not overlapped with the aperture 46 are removed. The remainder of the intermediate layer 34 covers the sidewall 48a of the annular ring, as shown in FIG. 8. For example, a lithography process can be used to form a photoresist layer covering a special region including the aperture 46 but not covering the predetermined region 56. A subsequent plasma etch process can downwardly remove the second sacrificial layer 36, the intermediate layer 34 and the first sacrificial layer 32 inside the predetermined region 56 until reaching the surface of the cap nitride layer 40.

Figure 9:
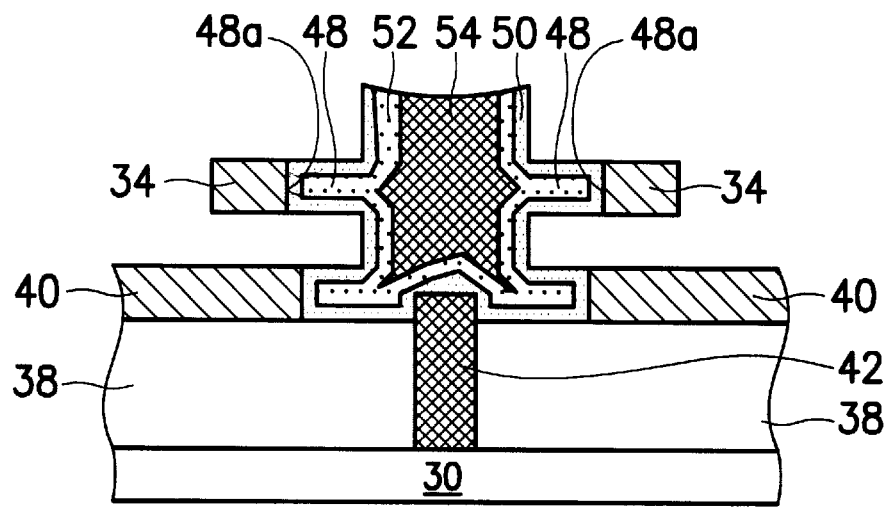

Next, the first sacrificial layer 32 and the second sacrificial layer 36 are removed to reveal the first amorphous silicon layer 50, as shown in FIG. 9. For example, a wet etching process with an etching solution of diluted hydrate fluoride (DHF) can be used to remove the first sacrificial layer 32 and the second sacrificial layer 36 since these two layers are made of silicon oxide.

Figure 10:
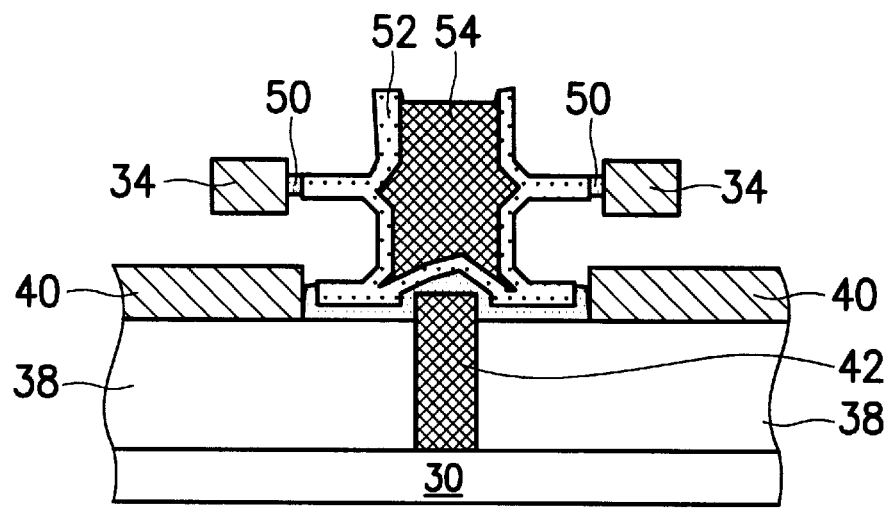

Next, a predetermined depth of the first amorphous silicon layer 50 is removed to reveal the second amorphous silicon layer 52, as shown in FIG. 10. For example, by a time-mode control, a wet etching process with an etching solution comprising a mixture of hydrogen peroxide and ammonia can remove a predetermined depth of the first amorphous silicon layer 50. Said etching solution, also called standard clean solution 1 (SC1), has a silicon etch rate proportional to the impurity concentration in the silicon film. Thus, under the control of etching time, SC1 solution can remove most of the first amorphous silicon layer 50 while removing very little of the second amorphous silicon layer 52. Furthermore, the first amorphous silicon layer 50 at the sidewall 48 of the annular ring must be kept to cover the second amorphous silicon layer 52, as shown in FIG. 10.

Figure 11:
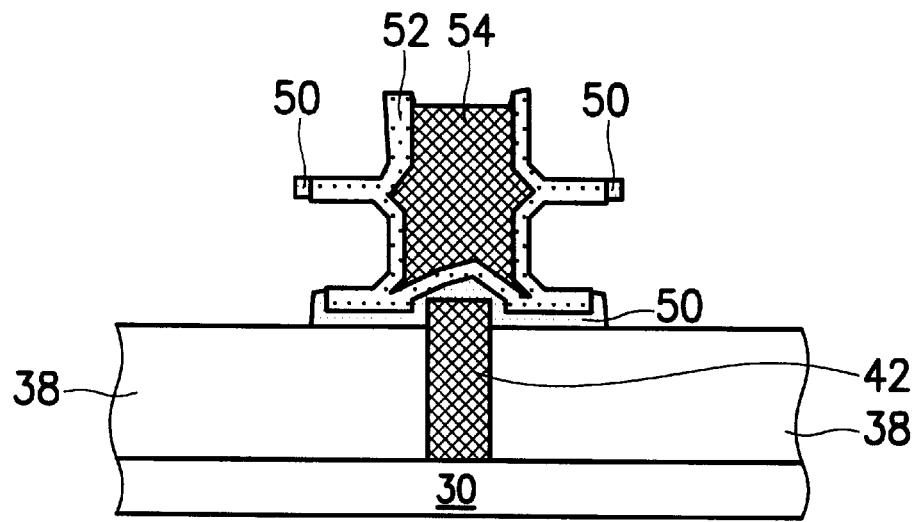

Then, the intermediate layer 34 is removed to reveal the first amorphous silicon layer 50 at the annular ring. For example, a wet etching process with an etching solution of hot phosphoric acid can be used to completely remove the intermediate layer 34 to reveal the first amorphous silicon layer 50 at the annular ring. Since the material of the cap nitride layer 40 is the same as that of the intermediate layer 34, and the cap nitride layer 40 is contacted by the etch solution during the wet etch process, the cap nitride layer 40 will be removed during this wet etch process, as shown in FIG. 11.

Figure 12:
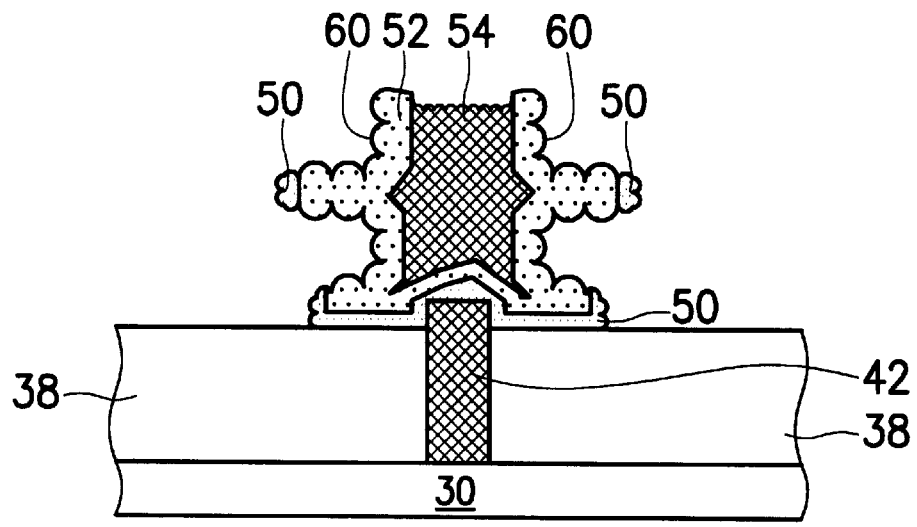

Finally, a plurality of hemispherical grains 60 are formed on the first amorphous silicon layer 50, the second amorphous silicon layer 52 and the third amorphous silicon layer 54, as shown in FIG. 12. For example, a pre-clean process is executed to remove the native oxide on the surface of the first amorphous silicon layer 50, the second amorphous silicon layer 52 and the third amorphous silicon layer 54. Then, silicon nuclei are selectively formed on the exposed surfaces of the first amorphous silicon layer 50, the second amorphous silicon 52 and the third amorphous silicon 54. In a preferred embodiment of the invention, the silicon nuclei are formed under the following conditions: a temperature of 560° C. to 580° C.; a pressure of less than $10^3$ torr; and a reactive gas comprising one of the group consisting silane ($SiH_4$) and disilane ($Si_2H_6$). After that, an annealing process is performed to transform the silicon nuclei into the hemispherical grains 60. The temperature of the annealing process is between 560° C. to 580° C., and the pressure for the annealing process is less than $10^{-6}$ torr. The profile of the bottom electrode according the present invention is shown in FIG. 12.

Figure 13:
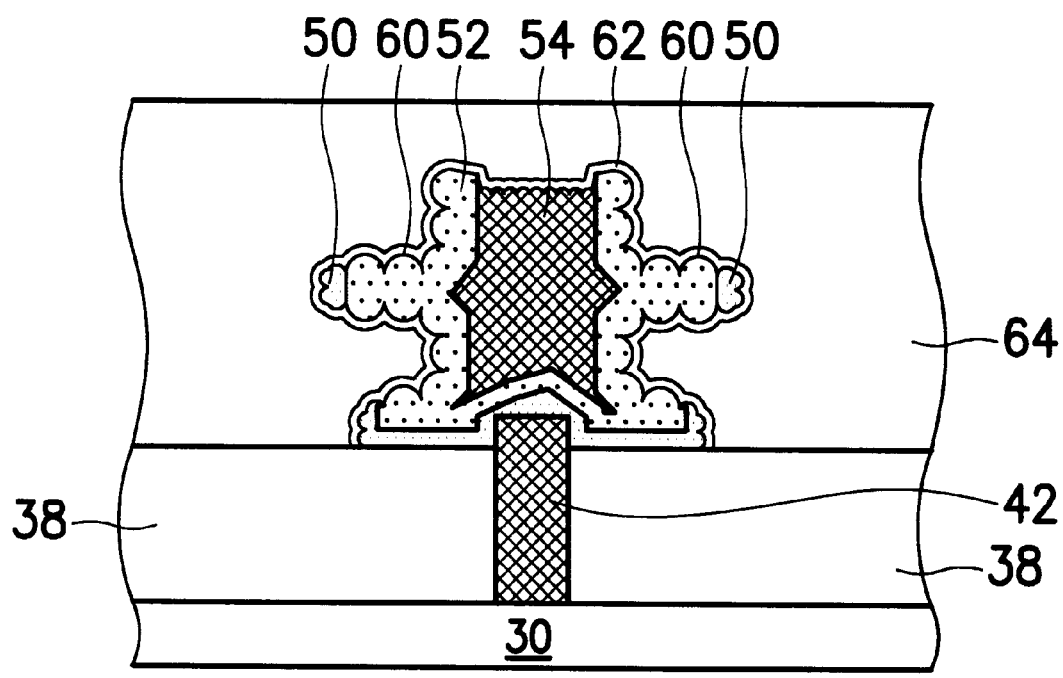

To finalize the fabrication of a capacitor, an inter-plate dielectric layer 62 and a top electrode 64 are sequentially formed on the bottom electrode, as shown in FIG. 13. For example, the inter-plate dielectric layer 62 can be a compound-layer composed of a bottom oxide layer, a nitride layer and a top oxide layer. The top electrode 64 can be made of amorphous silicon.

As shown in FIG. 13, the different impurity concentrations of the first amorphous silicon layer 50, the second amorphous silicon layer 52 and the third amorphous silicon layer 54 cause the different diameters of the hemispherical grains. The sidewall 48a of the annular ring, which is the closest portion of the bottom electrode to an adjacent bottom electrode, has hemispherical grains 60 with smaller diameter since the impurity concentration of the first amorphous silicon layer 50 is high ($2*10^{20}$ to $4*10^{20}$ atoms/cm$^3$). Thus, the present invention prevents the bottom electrode from shorting with the adjacent bottom electrode. Furthermore, most of the surface of the bottom electrode is made of the second amorphous silicon layer 52 with an impurity concentration of about zero. Thus, the hemispherical grains on the surface of the second amorphous silicon layer 52 have large diameters to enlarge the surface area of the bottom electrode. Thereby, the capacitance of the capacitor is increased.

In the present invention, the problem of depletion region induced by the low impurity concentration of the second amorphous silicon layer 52 is solved by the third amorphous silicon layer 54. After forming the bottom electrode, the process flow must include at least one thermal treatment process, such as an annealing process at 700° C. to cure the damage to devices induced by the plasma processes. During such a thermal treatment process, the impurity in the third amorphous silicon layer 54 diffuses into the second amorphous silicon layer 52 and the hemispherical grains 60, increasing the impurity concentration therein to decrease the width of the depletion region.

In contrast to the method of fabricating a bottom electrode in the prior art, the present method forms a bottom electrode using local impurity concentrations that are different at different places to prevent shorting with an adjacent bottom electrode while at the same time obtaining a larger capacitance. Furthermore, a subsequent thermal treatment process can make the impurity in the third amorphous silicon layer 54 diffuses to the second amorphous silicon layer 52 and the hemispherical grains 60 to avoid the problem of the depletion region.

While the invention has been described by way of example and in terms of the preferred embodiment, it is to be understood that the invention is not limited to the disclosed embodiment. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for fabricating a bottom electrode of a dynamic random access memory (DRAM) capacitor, comprising the following steps:

sequentially forming a first sacrificial layer, an intermediate layer and a second sacrificial layer on a substrate;

forming an aperture on the first sacrificial layer, the intermediate layer and the second sacrificial layer; forming an annular groove in the inner circumferential surface of the aperture by removing a fixed depth of the intermediate layer;

filling the aperture and the annular groove with a first amorphous silicon layer, a second amorphous silicon layer and a third amorphous silicon layer, wherein the second amorphous silicon layer has a lower impurity concentration than those of the first amorphous silicon layer and the third amorphous silicon layer, and the first amorphous silicon layer and the second amorphous silicon layer fill into the annular groove forms an annular ring;

removing the first sacrificial layer and the second sacrificial layer to reveal the first amorphous silicon layer;

removing a predetermined depth of the first amorphous silicon layer to reveal the second amorphous silicon layer;

removing the intermediate layer to reveal the first amorphous silicon layer at the annular ring; and forming a plurality of hemispherical grains on the first amorphous silicon layer, the second amorphous silicon layer and the third amorphous silicon layer.

2. The method of claim 1, wherein the substrate comprises an inter-poly dielectric layer and a cap nitride layer on the inter-poly dielectric layer.

3. The method of claim 2, wherein the substrate further comprises a poly-plug formed in the cap nitride layer and the inter-poly dielectric layer.

4. The method of claim 1, wherein the first sacrificial layer and the second sacrificial layer are both made of silicon oxide.

5. The method of claim 1, wherein the intermediate layer is made of silicon nitride.

6. The method of claim 1, wherein the aperture is formed by a plasma etching process to remove the second sacrificial layer, the intermediate layer and the first sacrificial layer within a first predetermined area of the aperture.

7. The method of claim 1, wherein the annular groove is formed by a wet etching process with an etching solution of hot phosphoric acid to remove a predetermined thickness of the intermediate layer in the inner circumferential surface of the aperture.

8. The method of claim 1, wherein the first amorphous silicon layer, the second amorphous silicon layer and the third amorphous silicon layer are formed by a low pressure chemical vapor deposition process at a temperature of 500° C. to 520° C.

9. The method of claim 1, wherein the impurity concentration of the second amorphous silicon layer is almost zero, the impurity concentration of the first amorphous silicon layer is between $2*10^{20}$ and $4*10^{20}$ atoms/cm$^3$, and the impurity concentration of the third amorphous silicon layer is higher than $4*10^{20}$ atoms/cm$^3$.

10. The method of claim 1, wherein the method further comprises a planarization step to make the top surfaces of the first amorphous silicon layer, the second amorphous silicon layer and the third amorphous silicon layer even with the surface of the second sacrificial layer.

11. The method of claim 1, wherein the method further comprises a step to remove the first sacrificial layer, the intermediate layer and the second sacrificial layer inside a second predetermined region which is not overlapped with the aperture, wherein the remainder of the intermediate layer covers the sidewall of the annular ring.

12. The method of claim 1, wherein the step of removing the first sacrificial layer and the second sacrificial layer is performed by a wet etching process with an etching solution of diluted hydrate fluoride.

13. The method of claim 1, wherein the step of removing a predetermined depth of the first amorphous silicon layer is performed by a wet etching process with an etching solution comprising a mixture of hydrogen peroxide and ammonia.

14. The method of claim 1, wherein the step of removing the intermediate layer to reveal the first amorphous silicon layer at the annular ring is performed by a wet etching process with an etching solution of hot phosphoric acid.

15. The method of claim 1, wherein the hemispherical grains are formed by the following steps:
   selectively forming silicon nuclei on the exposed surfaces of the first amorphous silicon, the second amorphous silicon and the third amorphous silicon; and
   performing an annealing process to transform the silicon nuclei into the hemispherical grains.

16. The method of claim 15, wherein the silicon nuclei are formed under the following conditions: a temperature of 560° C. to 580° C.; a pressure of less than $10^{-3}$ torr; and a reactive gas comprising one of the group consisting silane ($SiH_4$) and disilane ($Si_2H_6$).

17. The method of claim 15, wherein the temperature for the annealing process is between 560° C. and 580° C., and the pressure for the annealing process is less than $10^{-6}$ torr.

18. The method of claim 15, wherein, after forming the hemispherical grains, the method further comprises a thermal treatment process to make the impurity in the third amorphous silicon layer diffuses to the second amorphous silicon layer and the hemispherical grains and increases the impurity concentration therein.

* * * * *

UNITED STATES PATENT AND TRADEMARK OFFICE
CERTIFICATE OF CORRECTION

PATENT NO.   : 6,319,770 B1
DATED        : November 20, 2001
INVENTOR(S)  : Chine-Gie Lou It is certified that error appears in the above-identified patent and that said Letters Patent is hereby corrected as shown below:

<u>Title page,</u>
Item [73] Assignee, change "Taiwan Semiconductor Manufactruing Co., Ltd, Hsin-Chu (TW)" to -- Taiwan Semiconductor Manufacturing Co., Ltd., Hsin-Chu (TW) --

Signed and Sealed this

Twenty-eighth Day of May, 2002

*Attest:*

*Attesting Officer*

JAMES E. ROGAN
*Director of the United States Patent and Trademark Office*